United States Patent
Odnoblyudov et al.

(10) Patent No.: US 10,312,378 B2
(45) Date of Patent: Jun. 4, 2019

(54) LATERAL GALLIUM NITRIDE JFET WITH CONTROLLED DOPING PROFILE

(71) Applicant: QROMIS, Inc., Santa Clara, CA (US)

(72) Inventors: Vladimir Odnoblyudov, Danville, CA (US); Ozgur Aktas, Pleasanton, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/882,955

(22) Filed: Jan. 29, 2018

(65) Prior Publication Data

US 2018/0219106 A1   Aug. 2, 2018

Related U.S. Application Data

(60) Provisional application No. 62/452,272, filed on Jan. 30, 2017.

(51) Int. Cl.
*H01L 29/808*   (2006.01)
*H01L 29/66*   (2006.01)
(Continued)

(52) U.S. Cl.
CPC ........ *H01L 29/808* (2013.01); *H01L 29/0615* (2013.01); *H01L 29/0649* (2013.01);
(Continued)

(58) Field of Classification Search
CPC ....... H01L 29/808; H01L 29/36; H01L 29/12; H01L 29/1066; H01L 29/1058; H01L 29/0649; H01L 29/66446; H01L 29/0847; H01L 29/42312; H01L 29/41775; H01L 29/0615; H01L 29/2003

USPC .... 257/256, 259, 263, 76, 77, 194, E29.081, 257/E29.104, E29.194, E29.246, E29.312, 257/E21.098, E21.121, E21.126, E21.403,
(Continued)

(56) References Cited

U.S. PATENT DOCUMENTS 7,560,325 B1 * 7/2009 Merrett ............. H01L 29/66068
257/259
2005/0269660 A1 * 12/2005 Singh .................. H01L 29/1066
257/492
(Continued)

*Primary Examiner* — Dao H Nguyen
(74) *Attorney, Agent, or Firm* — Kilpatrick Townsend & Stockton LLP

(57) ABSTRACT

A lateral junction field-effect transistor includes a substrate of a first conductivity type having a dopant concentration; a first semiconductor layer of the first conductivity type having a first dopant concentration lower than the dopant concentration and disposed on the substrate; a second semiconductor layer of a second conductivity type having a second dopant concentration, the second conductivity type being different from the first conductivity type, the second semiconductor layer disposed on the first semiconductor layer; a third semiconductor layer of the first conductivity type having a third dopant concentration, the third semiconductor layer disposed on the second semiconductor layer; a fourth semiconductor layer of the first conductivity type having a fourth dopant concentration lower than the dopant concentration, the fourth semiconductor layer disposed on the third semiconductor layer; a source region and a drain region disposed in the second semiconductor layer and on opposite sides of the third semiconductor layer.

10 Claims, 12 Drawing Sheets

(51) Int. Cl.
  *H01L 29/08* (2006.01)
  *H01L 21/8252* (2006.01)
  *H01L 29/20* (2006.01)
  *H01L 29/06* (2006.01)
  *H01L 29/417* (2006.01)
  *H01L 29/423* (2006.01)
  *H01L 29/36* (2006.01)
  *H01L 29/10* (2006.01)
  *H01L 29/12* (2006.01)

(52) U.S. Cl.
  CPC ...... *H01L 29/0847* (2013.01); *H01L 29/1058* (2013.01); *H01L 29/1066* (2013.01); *H01L 29/12* (2013.01); *H01L 29/2003* (2013.01); *H01L 29/36* (2013.01); *H01L 29/41775* (2013.01); *H01L 29/42312* (2013.01); *H01L 29/66446* (2013.01); *H01L 29/66893* (2013.01)

(58) Field of Classification Search
  USPC ..... 257/E21.409, E27.06, E27.112; 438/172, 438/191, 192, 268, 285
  See application file for complete search history.

(56) References Cited

U.S. PATENT DOCUMENTS

| | | | |
|---|---|---|---|
| 2009/0072272 A1* | 3/2009 | Suh | H01L 29/1066 257/194 |
| 2012/0098035 A1* | 4/2012 | Bahl | H01L 29/66462 257/194 |
| 2014/0131721 A1* | 5/2014 | Nie | H01L 29/66909 257/76 |
| 2016/0141404 A1* | 5/2016 | Tsai | H01L 29/7787 257/76 |
| 2018/0026106 A1* | 1/2018 | Yeh | H01L 29/408 257/76 |

* cited by examiner

LATERAL GALLIUM NITRIDE JFET WITH CONTROLLED DOPING PROFILE

CROSS-REFERENCES TO RELATED APPLICATIONS

This application claims the benefit of U.S. Provisional Patent Application No. 62/452,272, filed on Jan. 30, 2017, the contents of which is incorporated by reference in its entirety.

FIELD OF THE INVENTION

The present invention relates to semiconductor technology, and more particularly to a lateral GaN junction field-effect transistor (FET) and the method of forming the same.

BACKGROUND OF THE INVENTION

For a power FET, the gate junction is usually biased at a high voltage in order to obtain high output power. In this case, a large electric field is formed in the channel below the gate edge on the drain side. Such a large electric field may result in a breakdown in the channel region between the gate and the drain electrode. One disadvantage of a high-electron mobility transistor (HEMT) is its limited ability to controlling junction field effects.

SUMMARY OF THE INVENTION

Embodiments of the present disclosure provide a lateral junction field-effect transistor that has a controlled doping profile that can reduce the electric field and increase the breakdown voltage. One advantage of the present disclosure is to keep the maximum electric field away from the surface of the transistor so that the surface passivation and the field plate can be reduced or eliminated.

Embodiments of the present disclosure provide a lateral junction field-effect transistor. The lateral junction field-effect transistor includes a substrate of a first conductivity type having a dopant concentration; a first semiconductor layer of the first conductivity type having a first dopant concentration lower than the dopant concentration and disposed on the substrate; a second semiconductor layer of a second conductivity type having a second dopant concentration, the second conductivity being different from the first conductivity type, the second semiconductor layer disposed on the first semiconductor layer; a third semiconductor layer of the first conductivity type having a third dopant concentration, the third semiconductor layer disposed on the second semiconductor layer; a fourth semiconductor layer of the first conductivity type having a fourth dopant concentration lower than the dopant concentration, the fourth semiconductor layer disposed on the third semiconductor layer; a source region and a drain region disposed in the second semiconductor layer and on opposite sides of the third semiconductor layer.

Embodiments of the present disclosure also provide a method of manufacturing a semiconductor device. The method may include providing a substrate of a first conductivity type having a dopant concentration; forming a first semiconductor layer of the first conductivity type having a first dopant concentration on the substrate, the first dopant concentration being lower than the dopant concentration of the substrate; forming a second semiconductor layer of a second conductivity type having a second dopant concentration on the substrate; forming a third semiconductor layer of the first conductivity type having a third dopant concentration on the second semiconductor layer; forming a fourth semiconductor layer of the first conductivity type having a third dopant concentration on the second semiconductor layer; and forming electric contacts on the second and fourth semiconductor layers.

The following detailed description together with the accompanying drawings will provide a better understanding of the nature and advantages of the present invention.

DETAILED DESCRIPTION OF SPECIFIC EMBODIMENTS

Embodiments of the present disclosure will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

Figure 1:
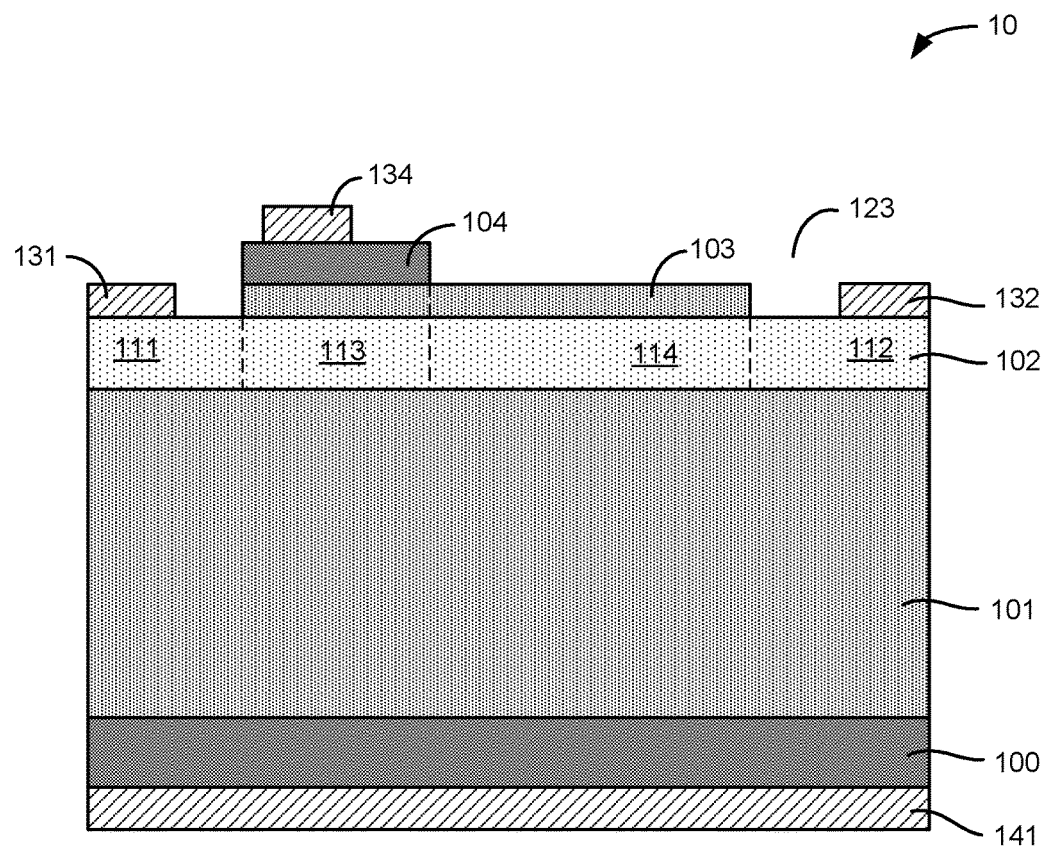
FIG. 1 is a cross-sectional view illustrating a lateral junction field-effect transistor according to one embodiment of the present disclosure.

FIG. 1 is a cross-sectional view illustrating a gallium nitride (GaN) lateral junction field-effect transistor 10 according to one embodiment of the present disclosure. Referring to FIG. 1, lateral junction field-effect transistor (LJFET) 10 includes a substrate 100 of a first conductivity type having a high dopant concentration. For example, substrate 100 is a GaN substrate having a high concentration of p-type dopants. The dopant concentration is uniformly distributed in substrate 100. LJFET 10 also includes a first semiconductor layer 101 on substrate 100, first semiconductor layer 101 includes GaN that may be epitaxially formed on substrate 100 and includes the first conductivity type having a first dopant concentration that is lower than the dopant concentration of substrate 100. LJFET 10 also includes a second semiconductor layer 102 of a second conductivity type having a second dopant concentration on first semiconductor layer 101, the second conductivity type is different form the first conductivity type. For example, if the first conductivity type is p-type, the second conductivity type is n-type, and vice versa. Second semiconductor layer 102 may be epitaxially formed on first semiconductor layer 101 and doped with n-type dopants. LJFET 10 also includes a third semiconductor layer 103 of the first conductivity type having a third dopant concentration on second semiconductor layer 102. LJFET 10 further includes a fourth semiconductor layer 104 of the first conductivity type having a fourth dopant concentration on third semiconductor layer 103.

In one embodiment, substrate 100 is a GaN substrate doped with p-type dopants having the high dopant concentration in the range between $1 \times 10^{19}$ atoms/cm$^3$ and $5 \times 10^{19}$ atoms/cm$^3$, preferably $2 \times 10^{19}$ atoms/cm$^3$. First semiconductor layer 101 is a GaN substrate doped with p-type dopants having the first dopant concentration in the range between $5 \times 10^{17}$ atoms/cm$^3$ and $5 \times 10^{18}$ atoms/cm$^3$, preferably $1 \times 10^{18}$ atoms/cm$^3$. Second semiconductor layer 102 is a GaN substrate doped with n-type dopants having the second dopant concentration in the range between $5 \times 10^{15}$ atoms/cm$^3$ and $5 \times 10^{16}$ atoms/cm$^3$, preferably $2 \times 10^{16}$ atoms/cm$^3$. Third semiconductor layer 103 is a GaN substrate doped with p-type dopants having the third dopant concentration in the range between $1 \times 10^{15}$ atoms/cm$^3$ and $9 \times 10^{15}$ atoms/cm$^3$, preferably $4 \times 10^{15}$ atoms/cm$^3$. Fourth semiconductor layer 104 is a GaN substrate doped with p-type dopants having the fourth dopant concentration in the range between $5 \times 10^{17}$ atoms/cm$^3$ and $5 \times 10^{18}$ atoms/cm$^3$, preferably $1 \times 10^{18}$ atoms/cm$^3$. In some embodiment, the first and fourth semiconductor layers may have the same dopant concentration. In a specific embodiment, the dopant concentration of the first and fourth semiconductor layers is about $1 \times 10^{18}$ atoms/cm$^3$.

In one embodiment, third semiconductor layer 103 is a blocking layer disposed between second semiconductor layer 102 and fourth semiconductor layer 104 and has a dopant concentration in the range between $5 \times 10^{15}$ atoms/cm$^3$ and $5 \times 10^{16}$ atoms/cm$^3$, preferably $2 \times 10^{16}$ atoms/cm$^3$. Fourth semiconductor layer 104 is a gate layer and may have the same conductivity type and the same dopant concentration as those of substrate 100.

In one embodiment, second semiconductor layer 102 includes a source region 111, a drain region 112, and a channel region 113 that is disposed below the fourth semiconductor layer (gate layer) and between source region 111 and drain region 112. Second semiconductor layer 102 also includes a portion 114 below a portion of the third layer and between channel region 113 and drain region 112.

In one embodiment, the channel region has a thickness of about 1.2 um and a dopant concentration of $2 \times 10^{16}$ atoms/cm$^3$, the fourth semiconductor layer is a gate having a length of about 3 um and a dopant concentration of $1 \times 10^{18}$ atoms/cm$^3$. There is an air gap 123 of about 15 um between the edge of fourth layer (i.e., gate layer) and the drain region 112. Third semiconductor layer 103 is the blocking layer and has a thickness of about 16 um and a dopant concentration of $4 \times 10^{15}$ atoms/cm$^3$.

In one embodiment, LJFET 10 also includes a source electrode 131 in contact with source region 111, a drain electrode 132 in contact with drain region 112, and a gate electrode 134 in contact with fourth semiconductor layer 104. The source, drain and gate electrodes are made of a metal material, e.g., copper, aluminum, tungsten, silver, gold, or a combination thereof.

In one embodiment, LJFET 10 also includes a backside source electrode 141 disposed on the backside of substrate 100. Backside source electrode 141 is a metal layer disposed along the bottom of LJFET 10 and is connected to source electrode 131 through a metal plug (i.e., a through-hole via). In one embodiment, a through-hole via may be formed through the substrate, the first and second semiconductors layers and may be filled with a conductive material. Backside source electrode 141 is configured to be a thermal ground for dissipating heat of LJFET 10.

Figure 2:
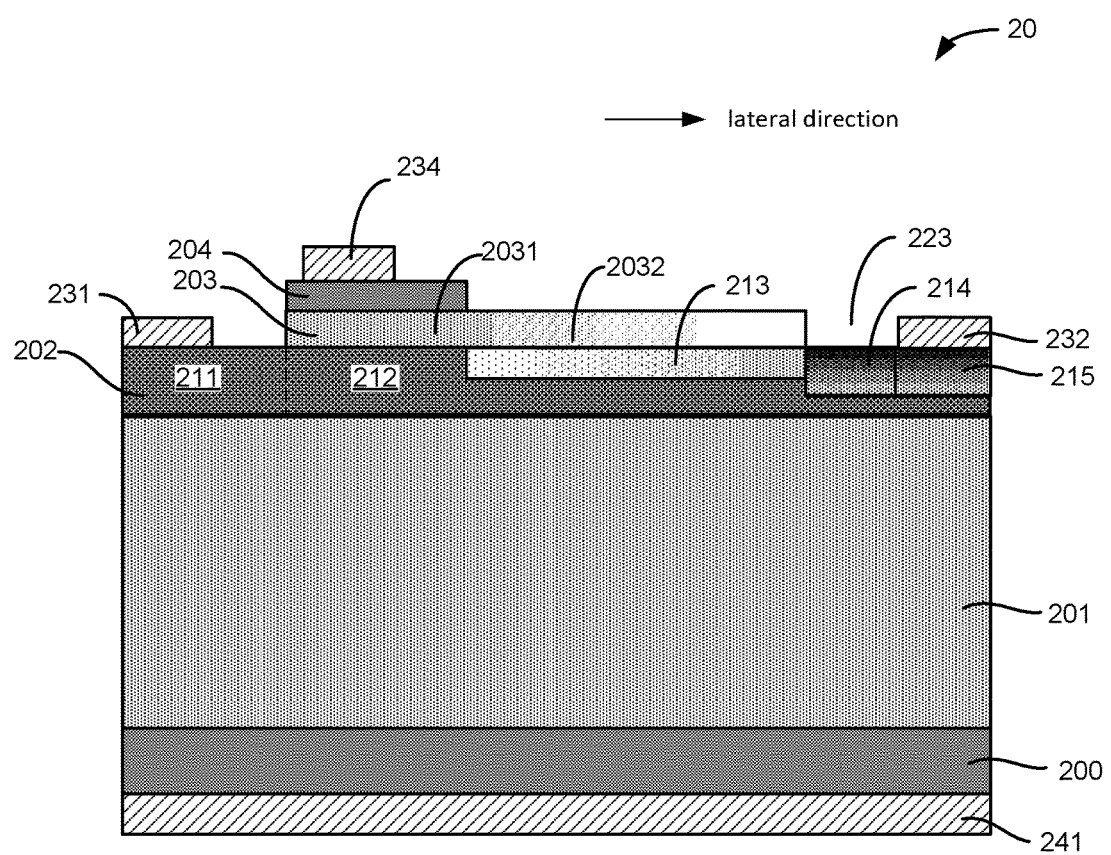
FIG. 2 is a cross-sectional view illustrating a lateral junction field-effect transistor according to another embodiment of the present disclosure.

FIG. 2 is a cross-sectional view illustrating a lateral junction field-effect transistor 20 according to another embodiment of the present disclosure. Lateral junction field-effect transistor (LJFET) 20 is similar to LJFET 10 in FIG. 1 with the differences that the dopant concentrations of the second and third semiconductor layers are not uniformly distributed.

Referring to FIG. 2, LJFET 20 includes a substrate 200 of a first conductivity type having a high dopant concentration (e.g., $2 \times 10^{19}$ atoms/cm$^3$). In one embodiment, substrate 200 is a highly doped p-type GaN substrate (referred herein as p GaN substrate). LJFET 20 further includes a first semiconductor layer 201 of the first conductivity type on substrate 200. In one embodiment, first semiconductor layer 201 may be an epitaxially formed p-type GaN layer having a first dopant concentration lower than that of the p GaN substrate. In another embodiment, first semiconductor layer 201 may be formed out of substrate 200 by implanting n-type dopants into the highly doped substrate so that its dopant concentration is lower than the dopant concentration of the substrate. Epitaxially formed first semiconductor layer 201 is referred to as a p-GaN layer. LJFET 20 further includes a second semiconductor layer 202 of a second conductivity type having a second dopant concentration on first semiconductor layer 201, the second conductivity type is different from the first conductivity type, second semiconductor layer 202 is an epitaxially formed n-type GaN layer (referred to as an n-GaN layer). LJFET 20 further includes a third semiconductor layer 203 of the first conductivity type having a third dopant concentration on second semiconductor layer 202, third semiconductor layer 203 is referred to as a p-blocking layer. LJFET 20 further includes a fourth semiconductor layer 204 of the first conductivity type having a fourth dopant concentration on third semiconductor layer 203, fourth semiconductor layer 204 is referred to as a gate layer. In one embodiment, fourth semiconductor layer 203 covers a portion of the surface of the third semiconductor layer. In another embodiment, fourth layer 203 covers the entire surface of the third semiconductor layer.

In contrast with the second and third semiconductor layers of LJFET 10 in FIG. 1, the second and third semiconductor layers in LJFET 20 each do not have a uniformly distributed dopant concentration profile. In one embodiment, third semiconductor layer 203 includes a first portion 2031 disposed below fourth semiconductor layer (i.e., gate layer) 204, and a second portion 2032 that is not covered by the fourth semiconductor layer. First portion 2031 has a uniformly distributed dopant concentration, and second portion 2032 has a gradually decreasing dopant concentration in the lateral direction toward the drain region. This dopant concentration form a higher level to a lower level will reduce the electric field formed between the gate and the drain. In one embodiment, first portion 2031 has a uniform dopant concentration of $2\times10^{19}$ atoms/cm$^3$, and second portion 2032 has a dopant concentration having $2\times10^{19}$ atoms/cm$^3$, which gradually decreases to 0 in the lateral direction to the distal end of third semiconductor layer 203. In one embodiment, first portion 2031 has a uniform dopant concentration of $2\times10^{19}$ atoms/cm$^3$, and second portion 2032 has a dopant concentration having $2\times10^{19}$ atoms/cm$^3$, which stepwise decreases to 0 in the lateral direction to the distal end of third semiconductor layer 203. In one embodiment, LJFET 20 also includes a gate electrode 234 on fourth semiconductor layer (gate layer) 204, a source electrode 231 and a drain electrode 232 disposed on second semiconductor layer 202 on opposite sides of fourth semiconductor layer 204. There is an air gap 223 between the edge of the third semiconductor layer and the drain electrode 232

In one embodiment, second semiconductor layer 202 includes a first portion 211 configured as a source region, a second portion 212 below the fourth layer (i.e., below first portion 2031 of third semiconductor layer 203) configured as a channel region, a third portion 213 below a portion of third semiconductor layer that is not covered by the forth semiconductor layer (i.e., below second portion 2032 of third semiconductor layer 203), a third portion 214 adjacent to air gap 223 between the third semiconductor layer and the drain electrode, and a fourth portion 215 below the drain electrode.

In one embodiment, first portion 211 of semiconductor layer 202 has a dopant concentration of about $3\times10^{18}$ atoms/cm$^3$; second portion 212 has a dopant concentration of about $2\times10^{16}$ atoms/cm$^3$; and third portion 213 has a dopant concentration of about $6\times10^{16}$ atoms/cm$^3$. In some embodiments, the dopant concentration of first, second, and third portions is uniform, i.e., it does not change across the portion. Fourth portion 214 and fifth portion 215 each have a dopant concentration that decreases in a stepwise manner in the direction toward the substrate. In one embodiment, the dopant concentration of fourth portion 214 decreases in a stepwise manner in the vertical direction (from top to bottom) from $3\times10^{18}$ atoms/cm$^3$ to $2\times10^{17}$ atoms/cm$^3$, and the dopant concentration of fifth portion 215 decreases in a stepwise manner in the vertical direction (from top to bottom) from $3\times10^{18}$ atoms/cm$^3$ to $4\times10^{17}$ atoms/cm$^3$. In one embodiment, the dopant concentration of third portion 213 decreases in the lateral direction from the distal end adjacent to fourth portion 214 to second portion. In one embodiment, third portion 213 may have a thickness equal to the thickness of the second semiconductor layer.

Figure 3A:
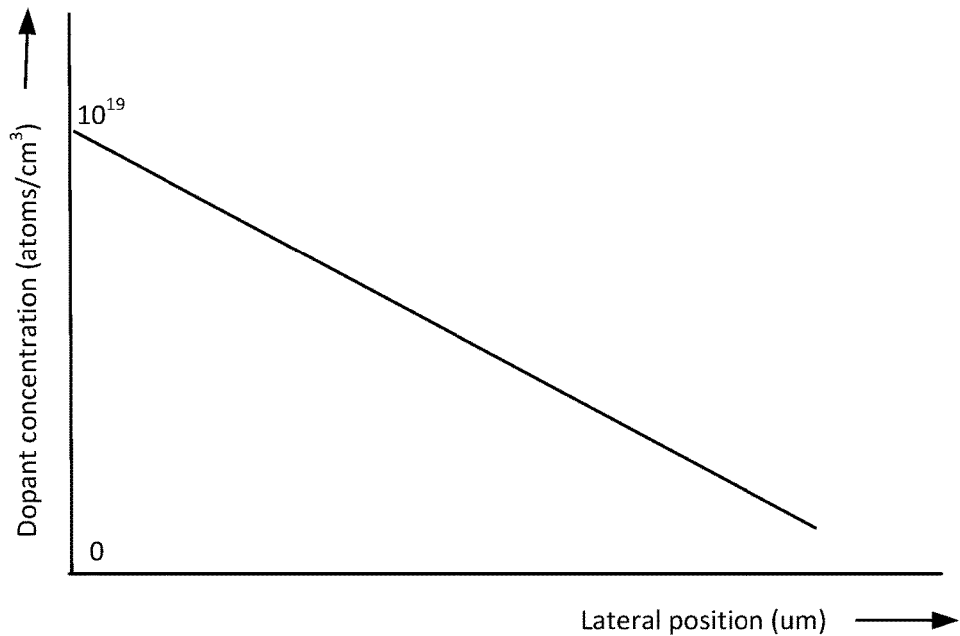
FIG. 3A is a graph illustrating a doping profile of a semiconductor layer according to one embodiment of the present disclosure.
Figure 3B:
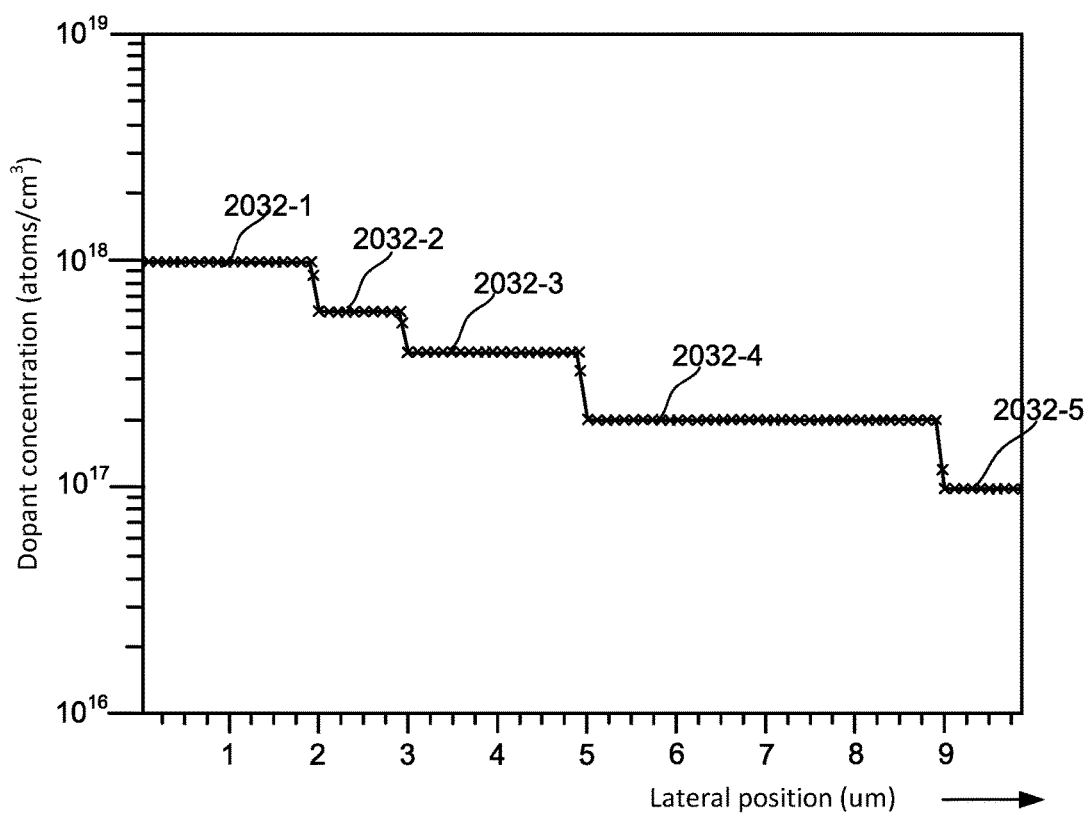
FIG. 3B is a graph showing a doping profile of a semiconductor layer according to another embodiment of the present disclosure.

FIG. 3A is a graph showing a linearly decreasing dopant concentration in second portion 2032 according to an embodiment of the present disclosure. The y-axis represents the dopant concentration in atoms/cm$^3$, and the x-axis represents the lateral position of the second portion in the third semiconductor layer. As shown in FIG. 3A, second portion 2032 of third semiconductor layer 203 has a dopant concentration that linearly decreases starting from the boundary of first portion 2031 toward the drain region. FIG. 3B is a graph showing a decreasing stepwise dopant concentration in second portion 2032 according to another embodiment of the present disclosure. In the example embodiment, second portion 2032 has a plurality of discrete lateral portions, e.g., portions 2032-1, 2032-2, 2032-3, 3032-4, 2032-5, etc. The lateral portions of second portion 2032 in microns (μm) is shown in the x-axis, and the dopant concentration in atoms/cm$^3$ is shown in the y-axis. In the example shown, the dopant concentration decreases in a stepwise manner in the lateral direction toward the drain region.

Figure 3C:
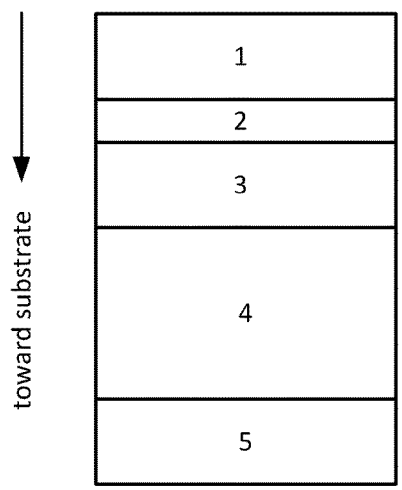
FIG. 3C is a cross-sectional view of an exemplary doping profile of a portion of a semiconductor layer according to one embodiment of the present disclosure.
Figure 3D:
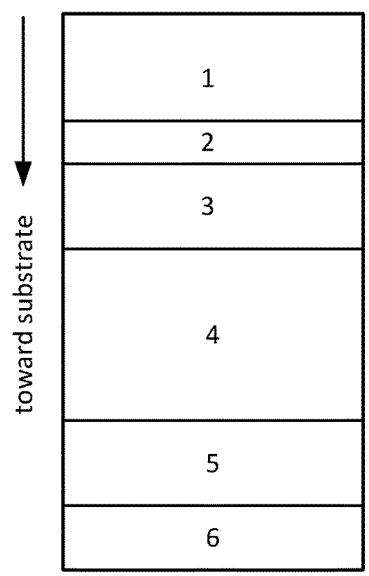
FIG. 3D is a cross-sectional view of an exemplary doping profile of a portion of a semiconductor layer according to one embodiment of the present disclosure.

FIG. 3C and FIG. 3D are cross-sectional views of exemplary doping profiles of fourth portion 214 and fifth portion 215, respectively. The depths (thicknesses) of the zones in fourth and fifth portions 214 and 215 may have the same dimension or different dimensions. In one embodiment, fourth portions 214 and 215 each have a depth of about 1 micron. In an example embodiment, the dopant concentration may have $3\times10^{18}$ atoms/cm$^3$ in zone 1 (i.e., from the upper surface of the second semiconductor layer to a first depth and decreases to $2\times10^{17}$ atoms/cm$^3$ in zone 5. It is understood that the number of zones in fourth portion 214 and fifth portion 215 can be any integer number N, i.e., it can be fewer than five or more than five. In the example shown in FIG. 3A, five zones are used, and in the example shown in FIG. 3D, six zones are used, but it is understood that the numbers are arbitrarily chosen for describing the example embodiment and should not be limiting.

Figure 4:
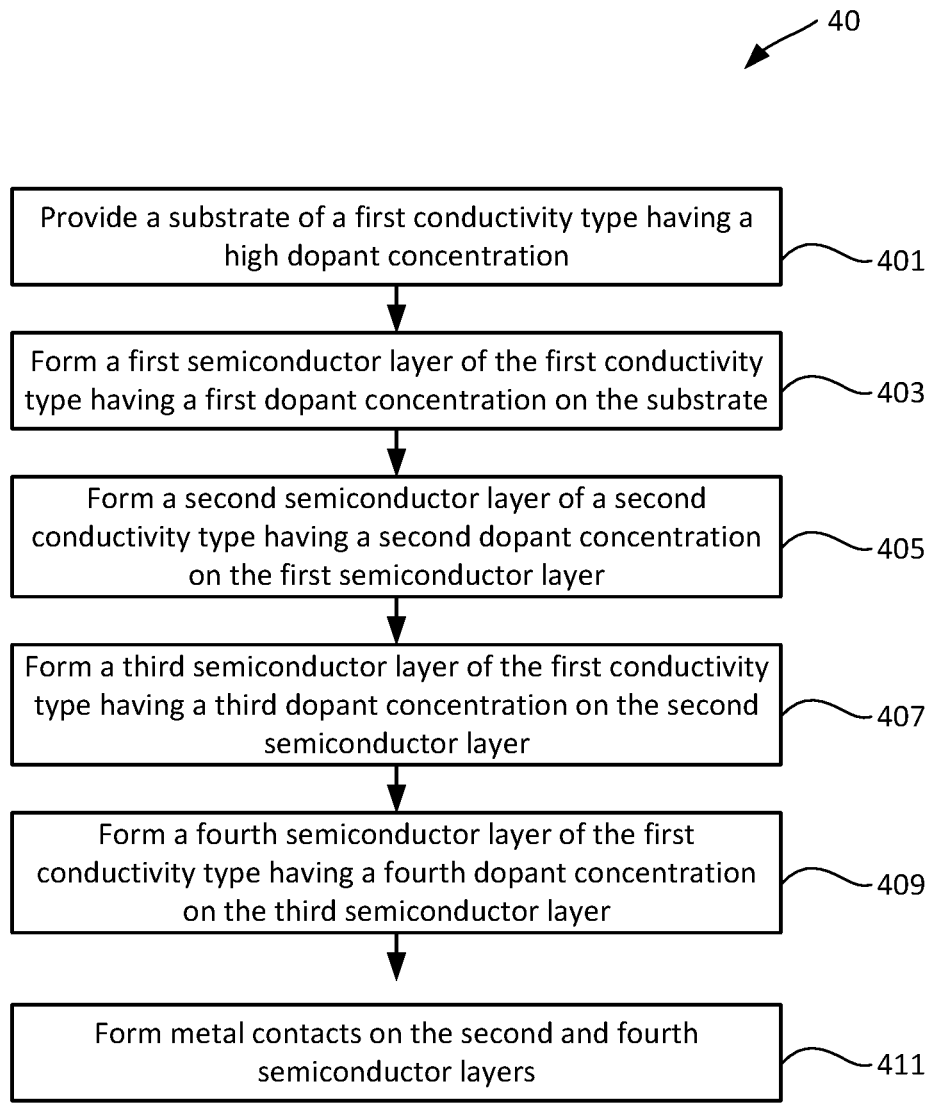
FIG. 4 is a flowchart of a manufacturing method of a semiconductor device according to one embodiment of the present disclosure.

FIG. 4 is a flowchart of a method 40 of manufacturing a semiconductor device according to one embodiment of the present disclosure. In the disclosure, each drawing or block in the flowchart diagram represents a process associated with embodiments of the method described. Those of skill in the art will recognize that additional blocks and drawings that describe the embodiments may be added.

Referring to FIG. 4, method 40 may include:

401: provide a semiconductor substrate of a first conductivity type having a uniformly distributed high dopant concentration.

403: form a first semiconductor layer of the first conductivity type having a first dopant concentration on the semiconductor substrate, the first dopant concentration is lower than the dopant concentration of the semiconductor substrate.

405: form a second semiconductor layer of a second conductivity type having a second dopant concentration on the first semiconductor layer, the second conductivity type is different from the second conductivity type.

407: form a third semiconductor layer of the first conductivity type having a third dopant concentration on the second semiconductor layer.

409: form a fourth semiconductor layer of the first conductivity type having a fourth dopant concentration on the third semiconductor layer.

411: form metal contacts on the second and fourth semiconductor layers for forming source, drain and gate electrodes.

Depending on the embodiment, additional steps may be added. For example, through holes may be formed across the first and second semiconductor layers and the substrate and filled with a metal material to formed vias, a conductive (e.g., copper) layer may be formed on the back side of the substrate and in contact with the source region through the vias.

FIGS. 5A-5F are cross-sectional views illustrating intermediate stages of a semiconductor device in a manufacturing method according to one embodiment of the present invention. FIGS. 5A-5F will be described with reference to FIG. 4.

Figure 5A:
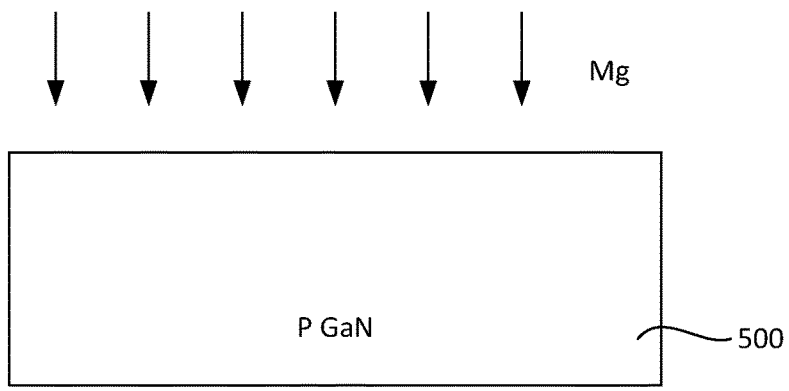
FIGS. 5A-5F are cross-sectional views illustrating intermediate stages of a semiconductor device in a manufacturing method according to one embodiment of the present invention.
Figure 5B:
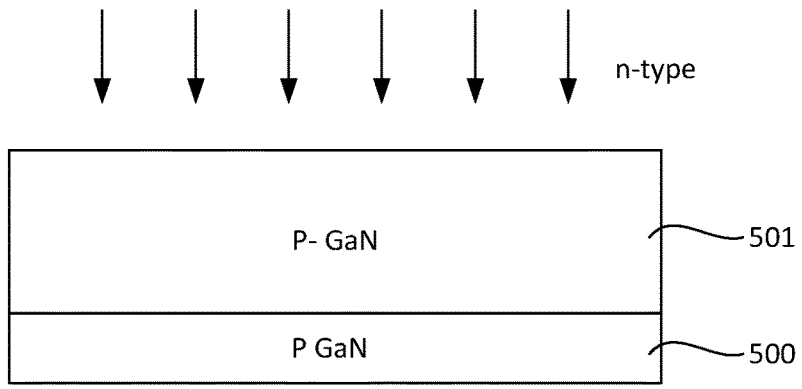

Referring to FIG. 4, in 401, a semiconductor substrate of a first conductivity type is provided. As shown in FIG. 5A, a gallium nitride (GaN) substrate 500 is provided. An ion implantation process is performed to implant p-type dopants to substrate 500. In one embodiment, magnesium (Mg) ions are implanted into substrate 500 to form a p GaN substrate having a high dopant concentration. In one embodiment, the dopant concentration of the p GaN substrate is in the range between $1\times10^{19}$ atoms/cm$^3$ and $5\times10^{19}$ atoms/cm$^3$, preferably $2\times10^{19}$ atoms/cm$^3$.

Next, in 403, a first semiconductor layer 501 is epitaxially formed on p GaN substrate 500. In one embodiment, first semiconductor layer 501 may be formed by performing an n-type ion implantation process into the magnesium doped p GaN to reduce the dopant concentration of the p GaN substrate to a first dopant concentration that is lower than the dopant concentration of the substrate 500 (indicated as p-GaN in FIG. 5B). In another embodiment, a first semiconductor layer is epitaxially formed on p GaN substrate 500. Thereafter, an n-type ion implantation process is performed into the epitaxially formed first semiconductor layer. In one embodiment, the first dopant concentration of first semiconductor layer 501 is in the range between $5\times10^{17}$ atoms/cm$^3$ and $5\times10^{18}$ atoms/cm$^3$, preferably $1\times10^{18}$ atoms/cm$^3$.

Figure 5C:
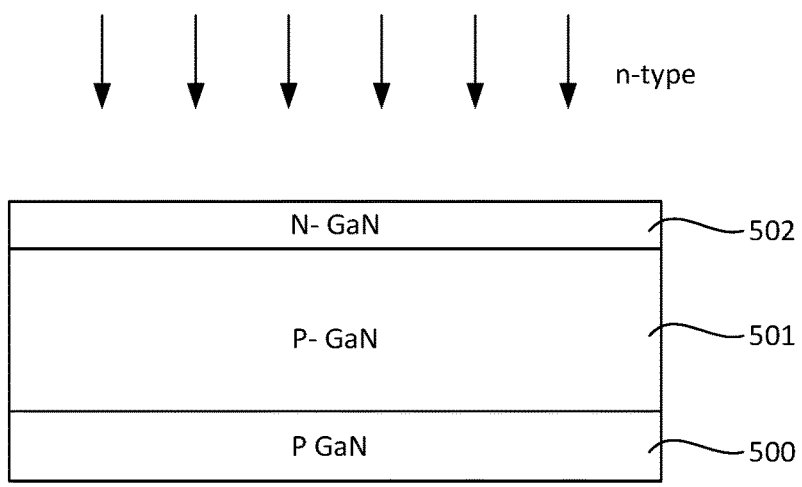

Next, in 405, a second semiconductor layer 502 of a second conductivity type is epitaxially formed on first semiconductor layer 501, as shown in FIG. 5C. Second semiconductor layer 502 may be epitaxially formed and has a second dopant concentration. In one embodiment, silicon (Si) is implanted into the second semiconductor layer, thereby increasing the n-type dopant concentration of the second semiconductor layer. In one embodiment, an ion implantation is performing by implanting n-type doped silicon dopants into second semiconductor layer 502 to increase the second (n-type) dopant concentration.

Figure 5D:
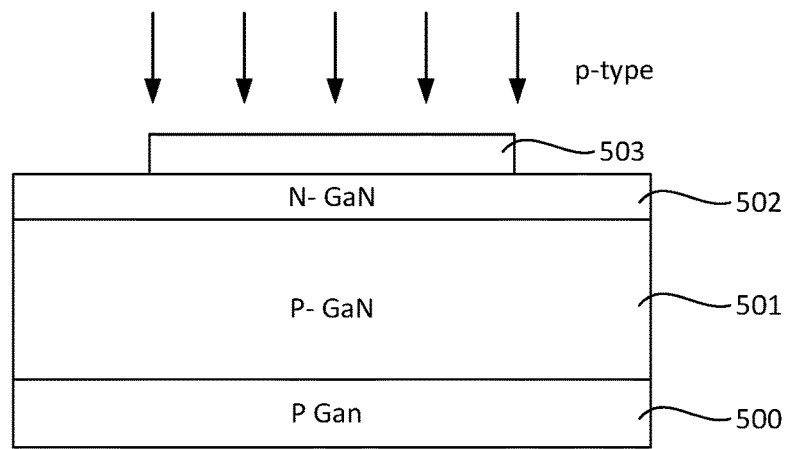

Next, in 407, a third semiconductor layer 503 of the first conductivity type is formed on second semiconductor layer 502, as shown in FIG. 5D. Third semiconductor layer 503 may be epitaxially formed on second semiconductor layer 502 and having a third dopant concentration. In one embodiment, an ion implantation may be performed to implant first conductivity type (e.g., p-type) dopants into third semiconductor layer 503 to obtain the third dopant concentration, which may be in the range between $1\times10^{15}$ atoms/cm$^3$ and $9\times10^{15}$ atoms/cm$^3$, preferably $4\times10^{15}$ atoms/cm$^3$. Thereafter, an etch process is perform to remove a portion of third semiconductor layer 503 using a patterned hardmask as a mask. The etch process can be a dry etch process, a wet etch process, or both the dry etch process and the wet etch process to remove the two distal ends of third semiconductor layer 503, as shown in FIG. 5D.

Figure 5E:
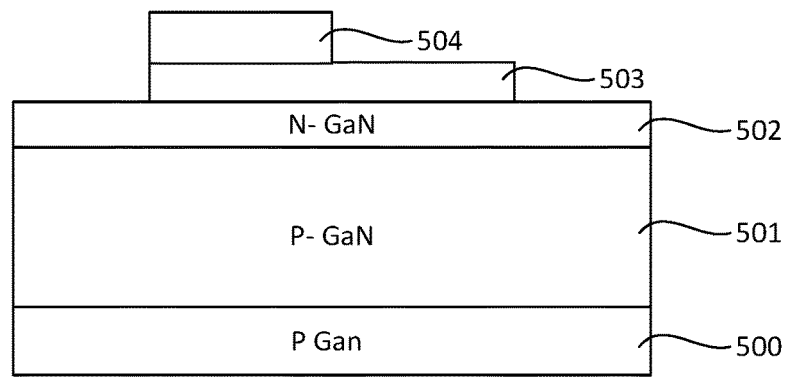

Next, in 409, a fourth semiconductor layer 504 of the first conductivity type is formed on third semiconductor layer 503, as shown in FIG. 5E. Fourth semiconductor layer 504 may be epitaxially formed on third semiconductor layer 503 and having a fourth dopant concentration. In one embodiment, an ion implantation may be performed to implant first conductivity type (e.g., p-type) dopant into fourth semiconductor layer 504 to obtain the fourth dopant concentration. Thereafter, an etch process is perform to remove a portion of fourth semiconductor layer 504 using a patterned hardmask as a mask. The etch process can be a dry etch process, a wet etch process, or both the dry etch process and the wet etch process. In one embodiment, the fourth semiconductor layer may covers the entire upper surface of the third semiconductor layer. In another embodiment, the fourth semiconductor layer is aligned with one distal end of the third semiconductor layer and exposes a portion of the surface in the vicinity of the opposite distal end of the third semiconductor layer, as shown in FIG. 5E.

Figure 5F:
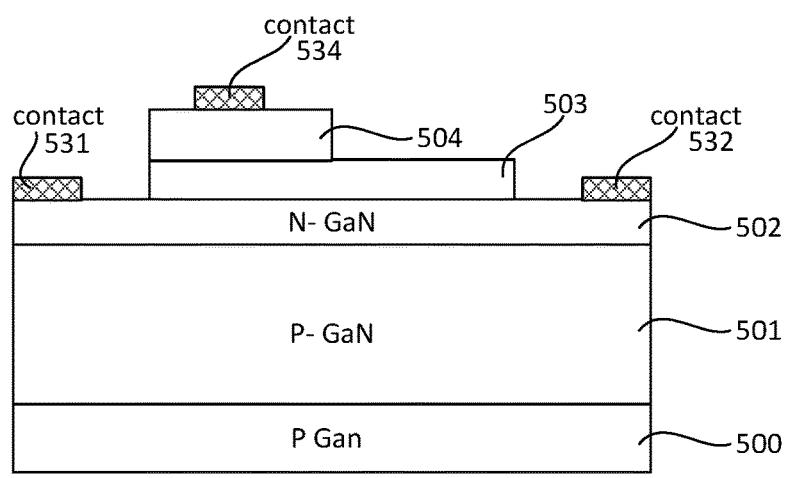

Next, in 411, metal contacts are formed on a portion of second semiconductor layer 502 and on a portion of fourth semiconductor layer 504, as shown in FIG. 5F. Metal contacts may be a source electrode 531 on the source region (211 in FIG. 2), a drain electrode 532 on the drain region (215 in FIG. 2) and a gate electrode 534 on gate layer 504. In some embodiments, a through-hole via may be formed extending through the substrate, first and second semiconductor layers using known through-hole forming processes. A metal layer is then formed on the backside of the substrate filling the through-hole to connect to the source electrode for thermal distribution and for improving the breakdown voltage of the semiconductor device.

In one embodiment, referring back to step 405 in FIG. 4 and FIG. 5C, performing the ion implantation into the second semiconductor layer may include a plurality of ion implantation steps. For example, a first patterned mask is formed on the second semiconductor layer having an opening exposing portion 213 of the second semiconductor layer (see FIG. 2), a first ion implantation having a first dopant dose is then performed with a first energy using the first patterned mask as a mask to implant n-type dopants into portion 213 until portion 213 has a desired doping profile (e.g., $6\times10^{16}$ atoms/cm$^3$). Next, a second patterned mask is formed on the second semiconductor layer having an opening exposing portion 214 (FIG. 2) of the second semiconductor layer, a second ion implantation having a second dopant dose is then performed with a second energy using the second patterned mask as a mask to implant n-type dopants into portion 214 until a first depth of portion 214 has a desired first doping profile (e.g., $2\times10^{17}$ atoms/cm$^3$). Then, a third ion implantation having a third dopant dose is performed with a third energy using the second patterned mask as a mask to implant n-type dopants into a second depth of portion 214 until a second depth of portion 214 has a desired second doping profile. The second depth is less than the first depth, and the second doping profile has a dopant concentration higher than that of the first doping profile. The ion implantation process may be repeated for the different zones (as shown in FIG. 3) of portion 214. In one embodiment, portion 214 may have 5 different depths denoted as zone 1, zone 2, zone 3, zone 4, and zone 5 as shown in FIG. 3 and FIG. 3A. The dopant concentration in Zone 5 is the lowest and is about $1\times10^{17}$ atoms/cm$^3$, while the dopant concentration in zone 1 is the highest and is about $1\times10^{18}$ atoms/cm$^3$, i.e., the dopant concentration difference between the highest doped zone and the lowest doped zone may be a factor of 10.

Similarly, portion 215 may be doped using the similar process steps as described above in connection with the doping steps of portion 214. The steps of doping portion 215 in different zones will not be described herein for the sake of brevity. In one embodiment, doping portion 214 and portion 215 may be performed concurrently, or at least some process steps of doping portion 214 and portion 215 may be shared. In another embodiment, portion 214 and 215 are doped sequentially. It will be appreciated that the sequence of doping portion 214 and portion 215 can be in a different order, i.e., portion 215 can be doped first following then by doping portion 214. Portion 214 and portion 215 may have the same depth or different depths. Portion 214 and portion 215 may have the same number of doped zones or different numbers of doped zones. In one embodiment, the number of doped zones of portion 215 is higher than the number of doped zones of portion 214. In one embodiment, portion 215 has a depth that is deeper than the depth of fourth portion 214.

Figure 6:
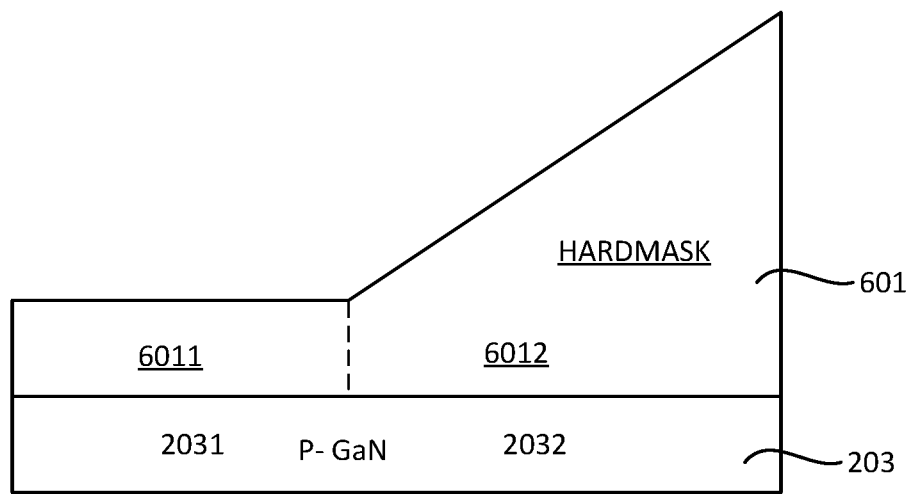
FIG. 6 is a cross-sectional view of a hardmask according to one embodiment of the present invention.

In one embodiment, referring back to step 407 in FIG. 4 and FIG. 2, third semiconductor layer 203 may include first portion 2031 having a uniformly distributed dopant concentration and second portion 2032 having a gradually decreasing dopant concentration in the lateral direction toward the drain region. Performing the ion implantation into the third semiconductor layer may include a plurality of ion implantation steps. In one example embodiment, a hardmask having a first portion with a constant thickness and a second portion with an increasing thickness is formed on third semiconductor layer 203. The first portion of the hardmask with the constant thickness is formed on first portion 2031 and the second portion of the hardmask with the increasing thickness is formed on second portion 2032 of third semiconductor layer 203. FIG. 6 is a cross-sectional view of a hardmask 601 having a fixed thickness portion 6011 and an increasing thickness portion 6012 according to one embodiment of the present invention. In one embodiment, hardmask 601 may be formed by depositing a hardmask layer (e.g., silicon nitride) on third semiconductor layer 203, then the hardmask layer is dipped into a hydrogen fluoride (HF) acid with different dipping time durations so that the thickness of the hardmask is etched with increasing dipping time durations to have the profile as shown in FIG. 6. In another embodiment, multiple patterned hardmask layers together with multiple ion implantations with different energy and dopant doses may be used to obtain a decreasing dopant concentration in second portion 2032 of third semiconductor layer 203.

Referring back to FIG. 2, the dopant concentration gradient of portion 213 in second semiconductor layer 202 may be similarly implemented as the process steps described in connection with the formation of second portion 2032 of third semiconductor layer 203. For example, a hardmask layer having a reverse profile of that of the hardmask in FIG. 6 may be formed on portion 213 of second semiconductor layer 202, and an n-type ion implantation process is performed on portion 213 using the hardmask layer as a mask to obtain the dopant concentration gradient of portion 213. In another exemplary embodiment, multiple patterned hardmask layers may be used together with multiple ion implantations with different energy may be performed to obtain the dopant concentration gradient of portion 213. As one of ordinary skill in the art would appreciate, a number of different processes may be used to obtain the dopant concentration gradient of portion 213 in second semiconductor layer 202

It should be appreciated that the specific steps illustrated in FIG. 4 provide a particular method of manufacturing a semiconductor device according to an embodiment of the present disclosure. Other sequences of steps may also be performed according to alternative embodiments. For example, alternative embodiments of the present disclosure may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
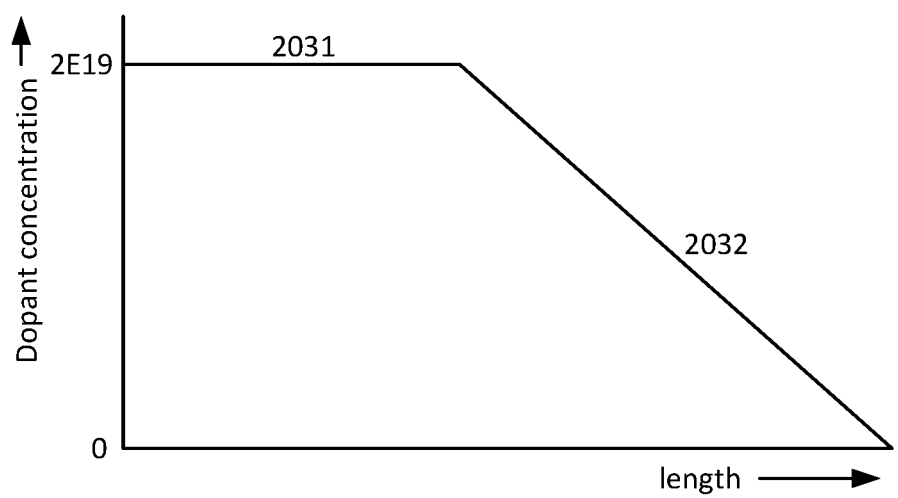
FIG. 7 is a graph illustrating a doping profile of a semiconductor layer according to one embodiment of the present disclosure.

FIG. 7 is a cross-sectional view of an exemplary doping profile of the third semiconductor layer (p-GaN) according to one embodiment of the present disclosure. The x-axis represents the lateral length of the third semiconductor layer, and the y-axis represents the dopant concentration. As shown in FIG. 7, the dopant concentration in the first portion 2031 is constant (e.g., $2\times10^{19}$ atoms/cm$^3$), and the dopant concentration in the second portion 2032 gradually decreases to 0 (zero).

Table 1 shows the performance of a conventional GaN HEMT vs. a GaN LJFET according to one embodiment of the present invention.

TABLE 1

| Metric | symbol | unit | GaN HEMT | GaN LJFET |
|---|---|---|---|---|
| Normalized $R_{on}$ | $R_{on}$ | mΩ * mm | X | 3X |
| Normalized $Q_{oss}$ | $Q_{oss}$ | nC/mm | Y | Y/3 |
| $R_{on} * Q_{oss}$ | | RQ | mΩ * nC | XY | XY |
| Breakdown voltage | Vbr | V | ~600 | >600 |
| HTRB | | | fail | pass |

Where X, Y are numbers denoting commonly observed HEMT properties. $R_{on}$ is normalized by the area of the transistor, $Q_{oss}$ is the charge stored at an output capacitance of the transistor, HTRB denotes the high temperature, reverse bias testing. As shown in Table 1, the GaN LJFET according to an embodiment of the present disclosure has the breakdown voltage that is greater than 600 V while having the same $R_{on}*Q_{oss}$ product as that of a conventional GaN HEMT.

Figure 8:
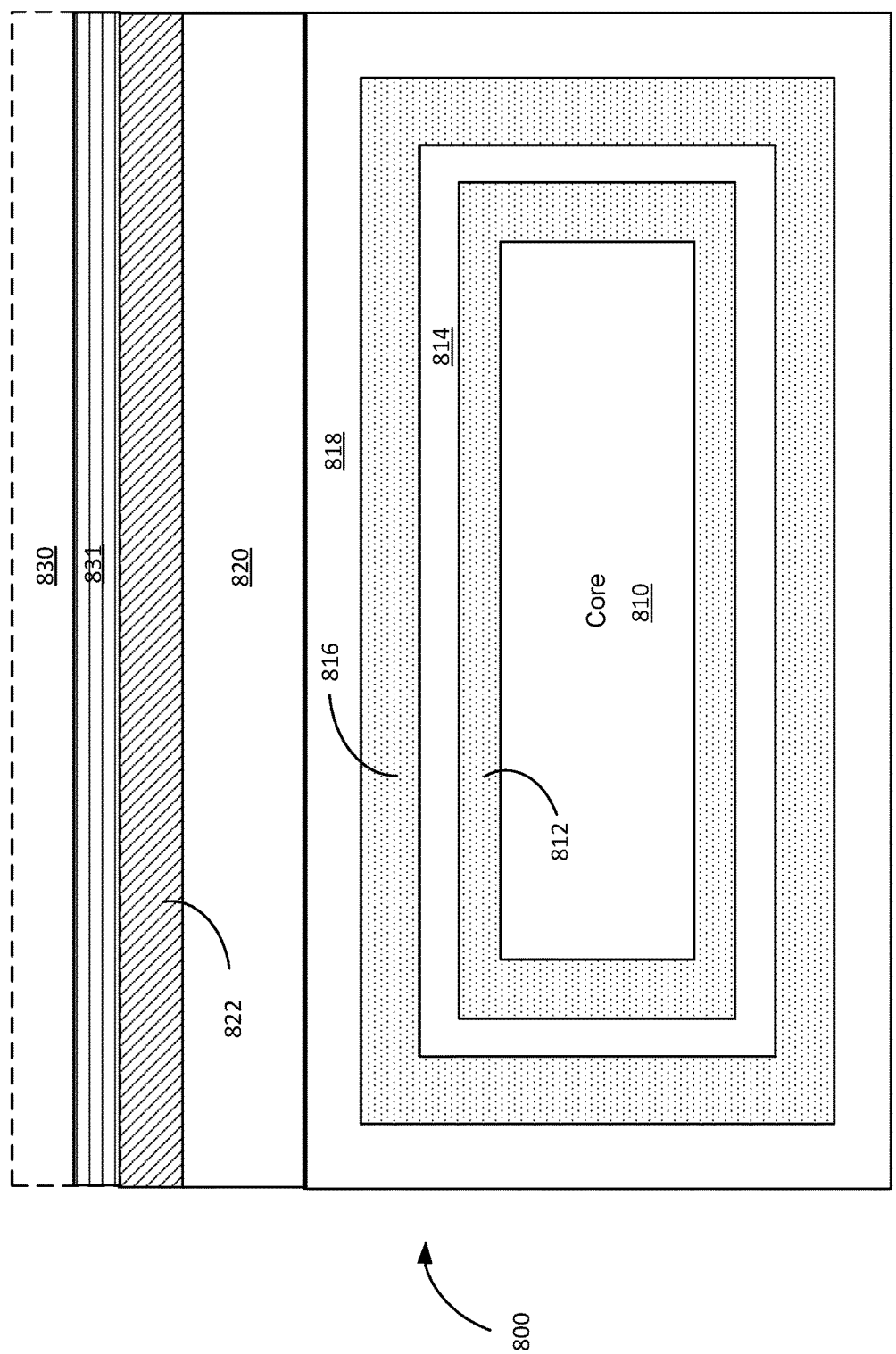
FIG. 8 is a simplified schematic diagram illustrating an engineered substrate structure according to an embodiment of the present disclosure.

FIG. 8 is a simplified schematic diagram illustrating an engineered substrate 800 according to an embodiment of the present invention. The engineered substrate 800 illustrated in FIG. 8 is suitable for a variety of electronic and optical applications. The engineered substrate includes a core 810 that can have a coefficient of thermal expansion (CTE) that is substantially matched to the CTE of the epitaxial material that will be grown on the engineered substrate 800. Epitaxial material 830 is illustrated as optional because it is not required as an element of the engineered substrate, but will typically be grown on the engineered substrate.

For applications including the growth of gallium nitride (GaN)-based materials (epitaxial layers including GaN-based layers), the core 810 can be a polycrystalline ceramic material, for example, polycrystalline aluminum nitride (AlN) with binding agents, such as yttrium oxide. The thickness of the core can be on the order of 100 to 1,500 μm, for example, 725 μm. The core 810 is encapsulated in a layer of tetraethyl orthosilicate (TEOS) oxide layer 812 on the order of 1,000 Å in thickness. The TEOS oxide layer 812 completely surrounds the core 810 in some embodiments to form a fully encapsulated core and can be formed using an LPCVD process.

A polysilicon layer 814 (i.e., polycrystalline silicon) is formed surrounding the TEOS oxide layer 812. The thickness of the polysilicon layer can be on the order of 500-5,000 Å, for example, 2,500 Å. The polysilicon layer 814 completely surrounds the TEOS oxide layer 812 in some embodiments to form a fully encapsulated TEOS oxide and can be formed using an LPCVD process. The polysilicon layer 814 is doped to provide a highly conductive layer, for example, doped with boron to provide a p-type polysilicon layer. In some embodiments, the doping with boron is at a level ranging from about $1\times10^{19}$ cm$^{-3}$ to about $1\times10^{20}$ cm$^{-3}$ to provide for high conductivity. The presence of the polysilicon layer 814 can provide a conductive layer useful during electrostatic chucking of the engineered substrate. One of ordinary skill in the art would recognize many variations, modifications, and alternatives.

A second TEOS oxide layer 816 is formed surrounding the polysilicon layer 814. The second TEOS oxide layer 816 is on the order of 1,000 Å in thickness. The second TEOS oxide layer 812 completely surrounds the polysilicon layer 814 in some embodiments to form a fully encapsulated structure and can be formed using an LPCVD process.

A silicon nitride layer 818 is formed surrounding the second TEOS oxide layer 816. The silicon nitride layer 818 is on the order of 1,000 Å to 10,000 Å in thickness. The silicon nitride layer 818 completely surrounds the second TEOS oxide layer 812 in some embodiments to form a fully encapsulated structure and can be formed using an LPCVD process.

In some embodiments, the silicon nitride layer prevents diffusion and/or outgassing of elements present in the core 810, for example, yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

The engineered substrate 800 also includes the engineered layers 820/822, an epi buffer 831 that is sandwiched between the engineered layers 820/822 and a GaN layer 830. Layer 820 may be a silicon oxide layer that is deposited on a portion of silicon nitride layer 818, e.g., on the top surface of silicon nitride layer 818 and subsequently used during the bonding of layer 822. Layer 822 may be a single crystal silicon layer and is suitable for use as a growth layer during an epitaxial growth process for the formation of the GaN layer 830. The GaN layer 830 can be utilized as the GaN substrate 100 for forming LJFET 10 or GaN substrate 200 for forming LJFET 20 described above. The epi buffer 831 may include a multi-layered structure. In one embodiment, the epi buffer layer 831 may include a plurality of stacked layers comprising an AlN layer having a thickness of about 0.2 µm. $Al_{0.25}Ga_{0.75}N$ layer having a thickness of about 0.125 µm, a SiN interlayer, and an undoped GaN layer. In one embodiment, the epi buffer layer 831 may include a plurality of stacked layers comprising an AlN layer having a thickness of about 0.2 µm, an $Al_{0.25}Ga_{0.75}N$ layer having a thickness of about 0.125 µm, a number of alternate SiN interlayer and undoped GaN layer (i.e., SiN/GaN/SiN/GaN). In one embodiment, The GaN layer 830 may be used as the substrate 100, 200, or 500 described in the above sections.

In one embodiment, the epi buffer layer 831 may include a stack of layers comprising an AlN layer, an $Al_{0.25}Ga_{0.75}N$ layer having a thickness of about 0.125 µm, a SiN interlayer, and an undoped GaN layer, where the AlN layer may include a thickness less than or greater than about 0.2 µm. In one embodiment, the epi buffer layer 831 may include a stack of layers comprising an AlN layer, an $Al_xGa_yN$ compound layer having a thickness of about 0.125 µm, a SiN interlayer, and an undoped GaN layer, where x=0.1-0.5 and y=0.5-0.9, x+y=1. In one embodiment, the epi buffer layer 831 may include a stack of layers comprising $AlN/Al_{0.5}Ga_{0.5}N/Al_{0.25}Ga_{0.75}N/Al_{0.15}Ga_{0.85}N/SiN/GaN$.

Figure 9:
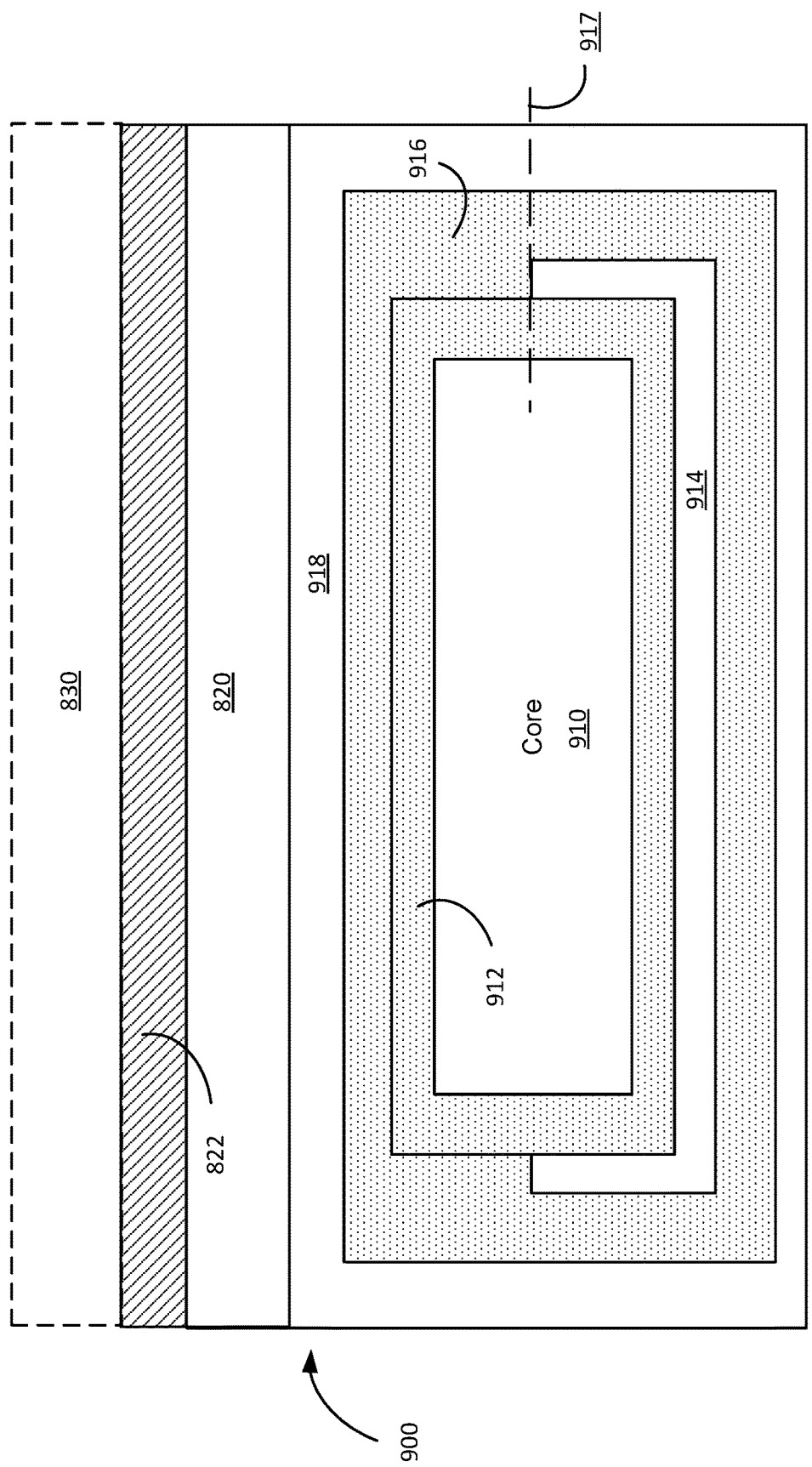
FIG. 9 is a simplified schematic diagram illustrating an engineered substrate structure according to some other embodiments of the present invention.

FIG. 9 is a simplified schematic diagram illustrating an engineered substrate structure according to an embodiment of the present invention. The engineered substrate 900 illustrated in FIG. 9 is suitable for a variety of electronic and optical applications. The engineered substrate includes a core 910 that can have a coefficient of thermal expansion (CTE) that is substantially matched to the CTE of the epitaxial material 830 that will be grown on the engineered substrate 900. The epitaxial material 830 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 910 can be a polycrystalline ceramic material, for example, polycrystalline aluminum nitride (AlN). The thickness of the core 910 can be on the order of 100 to 1,500 µm, for example, 725 µm. The core 910 is encapsulated in a first adhesion layer 912 that can be referred to as a shell or an encapsulating shell. In this implementation, the first adhesion layer 912 completely encapsulates the core, but this is not required by the present invention, as discussed in additional detail with respect to FIG. 10.

In an embodiment, the first adhesion layer 912 comprises a tetraethyl orthosilicate (TEOS) layer on the order of 1,000 Å in thickness. In other embodiments, the thickness of the first adhesion layer 912 varies, for example, from 100 Å to 2,000 Å. Although TEOS is utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition, for example, of conductive materials. The first adhesion layer 912 completely surrounds the core 910 in some embodiments to form a fully encapsulated core and can be formed using an LPCVD process. The adhesion layer 912 provides a surface on which subsequent layers adhere to form elements of the engineered substrate structure.

In addition to the use of LPCVD processes, furnace-based processes, and the like to form the encapsulating adhesion layer 912, other semiconductor processes can be utilized according to embodiments of the present invention. As an example, a deposition process, for example, CVD, PECVD, or the like, that coats a portion of the core 910 can be utilized, the core 910 can be flipped over, and the deposition process could be repeated to coat additional portions of the core.

A conductive layer 914 is formed on at least a portion of the first adhesion layer 912. In an embodiment, the conductive layer 914 includes polysilicon (i.e., polycrystalline silicon) that is formed by a deposition process on a lower portion (e.g., the lower half or backside) of the core/adhesion layer structure. In embodiments in which the conductive layer 914 is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 914 can be a polysilicon layer doped to provide a highly conductive material, for example, the conductive layer 914 can be doped with boron to provide a p-type polysilicon layer. In some embodiments, the doping with boron is at a level ranging from about $1\times10^{19}$ $cm^{-3}$ to $1\times10^{20}$ $cm^{-3}$ to provide for high conductivity. The presence of the conductive layer 914 is useful during electrostatic chucking of the engineered substrate to semiconductor processing tools, for example tools with electrostatic chucks (ESC). The conductive layer 914 enables rapid dechucking after processing. Thus, embodiments of the present invention provide substrate structures that can be processed in manners utilized with conventional silicon wafers. One of ordinary skill in the art would recognize many variations, modifications, and alternatives.

A second adhesion layer 916 (e.g., a second TEOS layer) is formed surrounding the conductive layer 914 (e.g., a polysilicon layer). The second adhesion layer 916 is on the order of 1,000 Å in thickness. The second adhesion layer 916 can completely surround the conductive layer 914 as well as the first adhesion layer 912 in some embodiments to form a fully encapsulated structure and can be formed using an LPCVD process. In other embodiments, the second adhesion layer 916 only partially surrounds the conductive layer 914, for example, terminating at the position illustrated by plane 917, which may be aligned with the top surface of the conductive layer 914. In this example, the top surface of the conductive layer 914 will be in contact with a portion of barrier layer 918. One of ordinary skill in the art would recognize many variations, modifications, and alternatives.

A barrier layer 918 (e.g., a silicon nitride layer) is formed surrounding the second adhesion layer 916. The barrier layer 918 is on the order of 4,000 Å to 5,000 Å in thickness in some embodiments. In some embodiments, the barrier layer 918 completely surrounds the second adhesion layer 916 to form a fully encapsulated structure and can be formed using an LPCVD process.

In some embodiments, the use of a silicon nitride barrier layer prevents diffusion and/or outgassing of elements present in the core 910, for example, yttrium oxide (i.e., yttria), oxygen, metallic impurities, other trace elements and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

Figure 10:
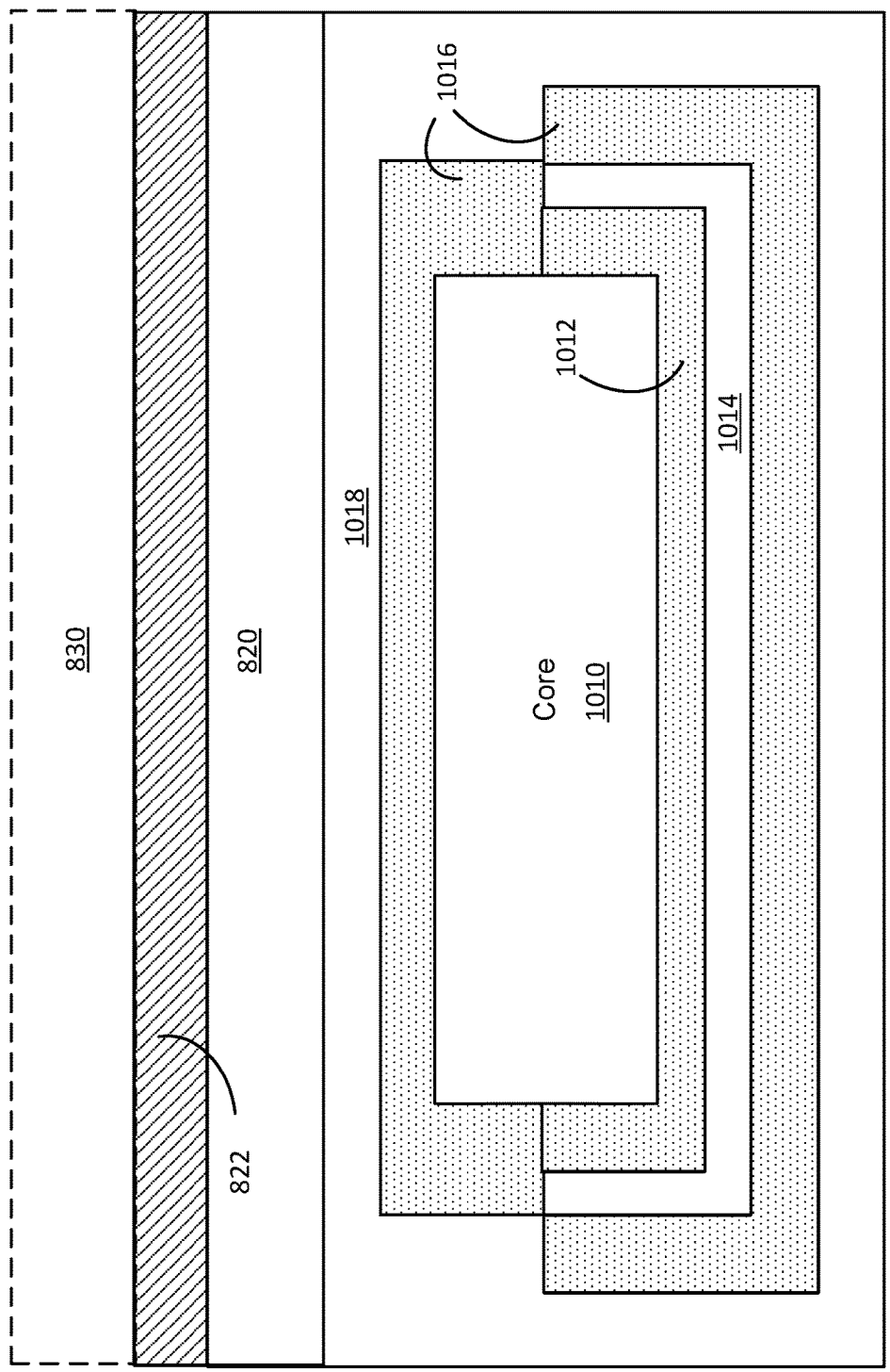
FIG. 10 is a simplified schematic diagram illustrating an engineered substrate structure according to some further embodiments of the present invention.

FIG. 10 is a simplified schematic diagram illustrating an engineered substrate structure according to another embodiment of the present invention. In the embodiment illustrated in FIG. 10, a first adhesion layer 1012 is formed on at least a portion of the core 1010, but does not encapsulate the core 1010. In this implementation, the first adhesion layer 1012 is formed on a lower surface of the core 1010 (the backside of the core 1010) in order to enhance the adhesion of a subsequently formed conductive layer 1014 as described more fully below. Although adhesion layer 1012 is only illustrated on the lower surface of the core 1010 in FIG. 10, it will be appreciated that deposition of adhesion layer material on other portions of the core 1010 will not adversely impact the performance of the engineered substrates structure and such material can be present in various embodiments. One of ordinary skill in the art would recognize many variations, modifications, and alternatives.

The conductive layer 1014 does not encapsulate the first adhesion layer 1012 and the core 1010, but is substantially aligned with the first adhesion layer 1012. Although the conductive layer 1014 is illustrated as extending along the bottom or backside and up a portion of the sides of the first adhesion layer 1012, extension along the vertical side is not required by the present invention. Thus, embodiments can utilize deposition on one side of the substrate structure, masking of one side of the substrate structure, or the like. The conductive layer 1014 can be formed on a portion of one side, for example, the bottom/backside, of the first adhesion layer 1012. The conductive 1014 layer provides for electrical conduction on one side of the engineered substrate structure, which can be advantageous in RF and high power applications. The conductive layer 1014 can include doped polysilicon as discussed in relation to the conductive layer 914 in FIG. 9.

A portion of the core 1010, portions of the first adhesion layer 1012, and the conductive layer 1014 are covered with a second adhesion layer 1016 in order to enhance the adhesion of the barrier layer 1018 to the underlying materials. The barrier layer 1018 forms an encapsulating structure to prevent diffusion from underlying layers as discussed above.

In addition to semiconductor-based conductive layers, in other embodiments, the conductive layer 1014 is a metallic layer, for example, 500 Å of titanium, or the like.

Referring once again to FIG. 10, depending on the implementation, one or more layers may be removed. For example, layers 1012 and 1014 can be removed, only leaving a single adhesion shell 1016 and the barrier layer 1018. In another embodiment, only layer 1014 can be removed. In this embodiment, layer 1012 may also balance the stress and the wafer bow induced by layer 820, deposited on top of layer 1018. The construction of a substrate structure with insulating layers on the top side of Core 1010 (e.g., with only insulating layer between core 1010 and layer 820) will provide benefits for power/RF applications, where a highly insulating substrate is desirable.

In another embodiment, the barrier layer 1018 may directly encapsulate core 1010, followed by the conductive layer 1014 and subsequent adhesion layer 1016. In this embodiment, layer 820 may be directly deposited onto the adhesion layer 1016 from the top side. In yet another embodiment, the adhesion layer 1016 may be deposited on the core 1010, followed by a barrier layer 1018, and then followed by a conductive layer 1014, and another adhesion layer 1012.

Referring to FIG. 10, the bonding layer 820 can be formed by a deposition of a thick (e.g., 4 μm thick) oxide layer followed by a chemical mechanical polishing (CMP) process to thin the oxide to approximately 1.5 μm in thickness. The thick initial oxide serves to fill voids and surface features present on the support structure that may be present after fabrication of the polycrystalline core and continue to be present as the encapsulating layers illustrated in FIG. 10 are formed. The oxide layer also serves as a dielectric layer for the devices. The CMP process provides a substantially planar surface free of voids, particles, or other features, which can then be used during a wafer transfer process to bond the single crystal layer 822 (e.g., a single crystal silicon layer) to the bonding layer 820. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 822 (e.g., a single crystal silicon layer) to the bonding layer 820. In some embodiments, a silicon wafer including the substantially single crystal layer 822 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. The thickness of the single crystal layer 822 can be varied to meet the specifications of various applications. Moreover, the crystal orientation of the single crystal layer 822 can be varied to meet the specifications of the application. Additionally, the doping levels and profile in the single crystal layer can be varied to meet the specifications of the particular application. In some embodiments, the depth of the implant may be adjusted to be greater than the desired final thickness of single crystal layer 822. The additional thickness allows for the removal of the thin portion of the transferred substantially single crystal layer that is damaged, leaving behind the undamaged portion of the desired final thickness. In some embodiments, the surface roughness can be modified for high quality epitaxial growth. One of ordinary skill in the art would recognize many variations, modifications, and alternatives.

In some embodiments, the single crystal layer 822 can be thick enough to provide a high quality lattice template for the subsequent growth of one or more epitaxial layers but thin enough to be highly compliant. The single crystal layer 822 may be said to be "compliant" when the single crystal layer 822 is relatively thin such that its physical properties are less constrained and able to mimic those of the materials surrounding it with less propensity to generate crystalline defects. The compliance of the single crystal layer 822 may be inversely related to the thickness of the single crystal layer 822. A higher compliance can result in lower defect densities in the epitaxial layers grown on the template and enable thicker epitaxial layer growth. In some embodiments, the thickness of the single crystal layer 822 may be increased by epitaxial growth of silicon on the exfoliated silicon layer.

In some embodiments, adjusting the final thickness of the single crystal layer 822 may be achieved through thermal oxidation of a top portion of an exfoliated silicon layer, followed by an oxide layer strip with hydrogen fluoride (HF) acid. For example, an exfoliated silicon layer having an initial thickness of 0.5 μm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for ($SiO_2$:Si). A high etch selectivity may reduce the surface roughness by a similar factor from the initial surface roughness. However, the surface roughness of the resultant single crystal layer 822 may still be larger than desired. For example, a bulk Si (111) surface may have a root-mean-square (RMS) surface roughness of less than 0.1 nm as determined by a 2 μm×2 μm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 μm×30 μm AFM scan area.

If the surface roughness of the single crystal layer 822 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

Figure 11:
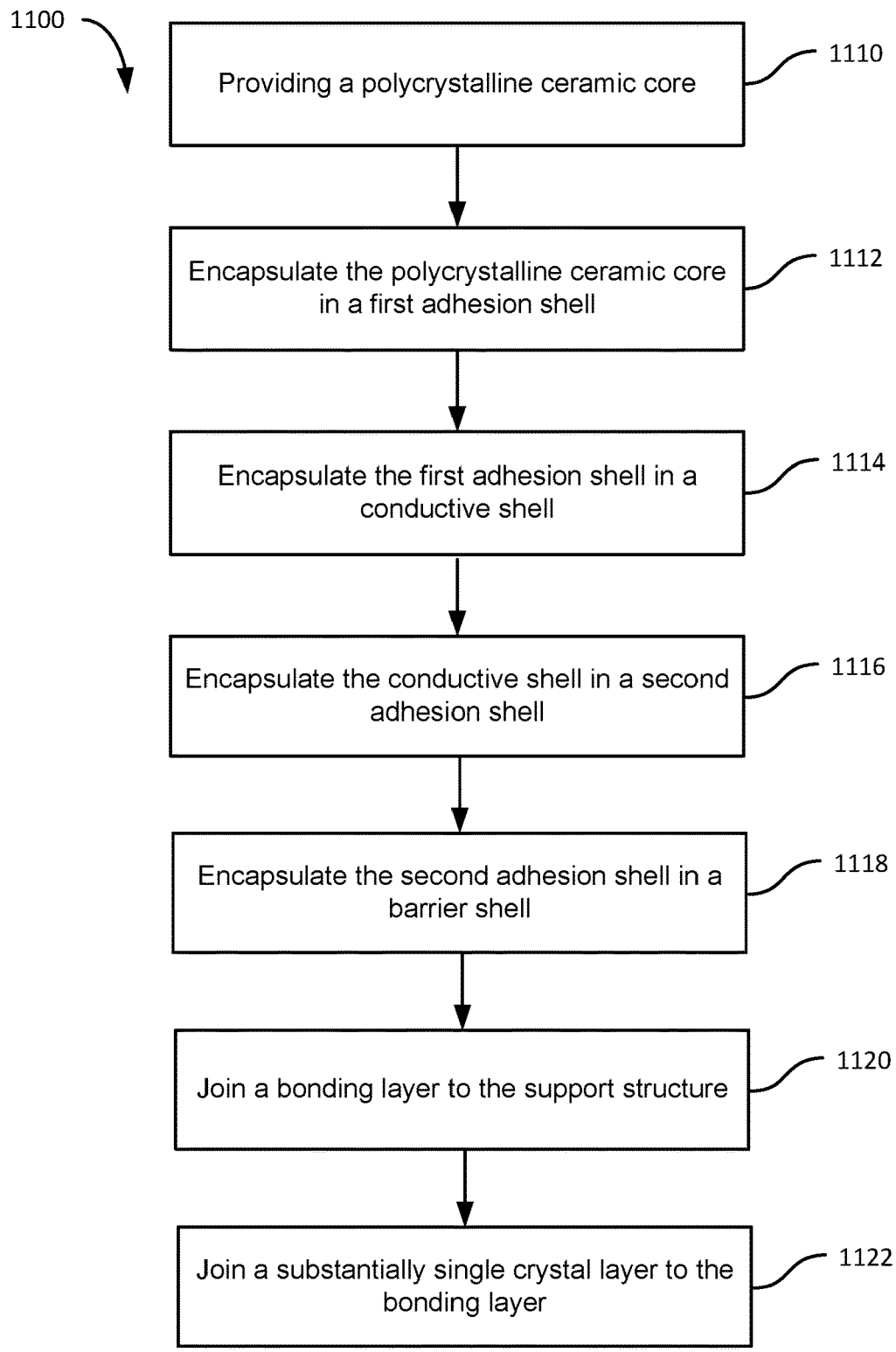
FIG. 11 is a simplified flowchart illustrating a method of fabricating an engineered substrate according to some embodiments of the present invention.

FIG. 11 is a simplified flowchart illustrating a method 1100 of fabricating an engineered substrate according to an embodiment of the present invention. The method 1100 can be utilized to manufacture a substrate that is CTE matched to one or more of the epitaxial layers grown on the substrate. The method 1100 includes forming a support structure by providing a polycrystalline ceramic core (1110), encapsulating the polycrystalline ceramic core in a first adhesion layer forming a shell (1112) (e.g., a tetraethyl orthosilicate (TEOS) oxide shell), and encapsulating the first adhesion layer in a conductive shell (1114) (e.g., a polysilicon shell). The first adhesion layer can be formed as a single layer of TEOS oxide. The conductive shell can be formed as a single layer of polysilicon.

The method 1100 also includes encapsulating the conductive shell in a second adhesion layer (1116) (e.g., a second TEOS oxide shell) and encapsulating the second adhesion layer in a barrier layer shell (1118). The second adhesion layer can be formed as a single layer of TEOS oxide. The barrier layer shell can be formed as a single layer of silicon nitride.

Once the support structure is formed by processes 1110-1118, the method 1100 further includes joining a bonding layer (e.g., a silicon oxide layer) to the support structure (1120) and joining a substantially single crystal layer, for example, a single crystal silicon layer, to the silicon oxide layer (1122). Other substantially single crystal layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

It should be appreciated that the specific steps illustrated in FIG. 11 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the present disclosure are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A lateral junction field-effect transistor comprising:
   a substrate of a first conductivity type having a dopant concentration;
   a first semiconductor layer of the first conductivity type having a first dopant concentration lower than the dopant concentration of the substrate and disposed on the substrate;
   a second semiconductor layer of a second conductivity type having a second dopant concentration, the second conductivity type being different from the first conductivity type, the second semiconductor layer disposed on the first semiconductor layer;
   a third semiconductor layer of the first conductivity type having a third dopant concentration, the third semiconductor layer disposed on the second semiconductor layer;
   a fourth semiconductor layer of the first conductivity type having a fourth dopant concentration lower than the dopant concentration, the fourth semiconductor layer disposed on the third semiconductor layer; and
   a source region and a drain region disposed in the second semiconductor layer and on opposite sides of the third semiconductor layer.

2. The lateral junction field-effect transistor of claim 1 further comprising:
   a source electrode on the source region;
   a drain electrode on the drain region; and
   a gate electrode on the fourth semiconductor layer.

3. The lateral junction field-effect transistor of claim 2 further comprising a backside source electrode on a backside of the substrate, wherein the backside source electrode and the source electrode are electrically connected together.

4. The lateral junction field-effect transistor of claim 1 wherein the first dopant concentration and the fourth dopant concentration have a same dopant concentration.

5. The lateral junction field-effect transistor of claim 1 wherein the third dopant concentration of the third semiconductor layer comprises a first portion below the fourth semiconductor layer having a uniformly distributed dopant concentration and a second portion not below the fourth semiconductor layer having a gradually decreasing dopant concentration in a lateral direction toward the drain region.

6. The lateral junction field-effect transistor of claim 1 further comprising an air gap between the third semiconductor layer and the drain region.

7. The lateral junction field-effect transistor of claim 6 wherein the second dopant concentration of the second semiconductor layer comprises:
   a first dopant concentration portion in the source region;
   a second dopant concentration portion in a portion of the second semiconductor layer between the source region and the drain region;
   a third dopant concentration portion below a portion of the third semiconductor layer that is not below the fourth semiconductor layer;
   a fourth dopant concentration portion below the air gap; and
   a fifth dopant concentration portion adjacent the fourth dopant concentration portion,
   wherein:
   the first dopant concentration portion has a same dopant concentration as the second dopant concentration;

the third dopant concentration portion has a gradually decreasing dopant concentration in a lateral direction toward the source region; and the fourth dopant concentration portion and the fifth dopant concentration portion each have a dopant concentration that gradually decreases stepwise in a vertical direction toward the substrate.

8. The lateral junction field-effect transistor of claim 7 wherein the fourth dopant concentration portion has a first number of zones having different dopant concentrations in the vertical direction, and the fifth dopant concentration portion has a second number of zones having different dopant concentrations in the vertical direction.

9. The lateral junction field-effect transistor of claim 8 wherein the first number of zones is less than the second number of zones.

10. The lateral junction field-effect transistor of claim 8 wherein each zone has a constant dopant concentration.

\* \* \* \* \*